(12) United States Patent
Pedretti et al.

(10) Patent No.: US 12,347,490 B2
(45) Date of Patent: Jul. 1, 2025

(54) COMPACT k-XOR-SAT FILTERING WITH CAMS

(71) Applicant: HEWLETT PACKARD ENTERPRISE DEVELOPMENT LP, Spring, TX (US)

(72) Inventors: Giacomo Pedretti, Milan (IT); Todd Richmond, Ft. Collins, CO (US); Thomas Van Vaerenbergh, Flemish Brabant (BE)

(73) Assignee: Hewlett Packard Enterprise Development LP, Spring, TX (US)

( * ) Notice: Subject to any disclaimer, the term of this patent is extended or adjusted under 35 U.S.C. 154(b) by 195 days.

(21) Appl. No.: 18/447,776

(22) Filed: Aug. 10, 2023

(65) Prior Publication Data
US 2025/0054547 A1 Feb. 13, 2025

(51) Int. Cl.
 G11C 15/04 (2006.01)
 H03K 19/21 (2006.01)
(52) U.S. Cl.
 CPC ........... *G11C 15/046* (2013.01); *H03K 19/21* (2013.01)

(58) Field of Classification Search
 CPC .............................. G11C 15/046; H03K 19/20
 See application file for complete search history.

(56) References Cited

U.S. PATENT DOCUMENTS 12,001,716 B2 * 6/2024 Advani ................ G06F 3/0679
2019/0332708 A1 * 10/2019 Strachan ............. G06F 16/2468

* cited by examiner

*Primary Examiner* — Xiaochun L Chen
(74) *Attorney, Agent, or Firm* — Dickinson Wright

(57) ABSTRACT

Examples of the presently disclosed technology provide CAM-based circuits specially constructed to implement Boolean satisfiability problems involving k-XOR-SAT clauses. With the strategic addition of auxiliary counting and logic circuits that evaluate match line voltage outputs of a CAM at k discrete times in order to determine whether a counted number of matches returned by a match line satisfies a pre-determine parity condition—where k represents a number of literals of a k-XOR-SAT clause of a Boolean satisfiability problem—a circuit of the present technology can leverage a common CAM (i.e., the same CAM) to implement the k-XOR-SAT clause and k-SAT clauses. Accordingly, this extremely versatile circuit can be used to implement k-XOR-SAT and k-SAT-k-XOR-SAT hybrid problems in less time, and with less hardware and power consumption than existing hardware accelerators.

20 Claims, 9 Drawing Sheets

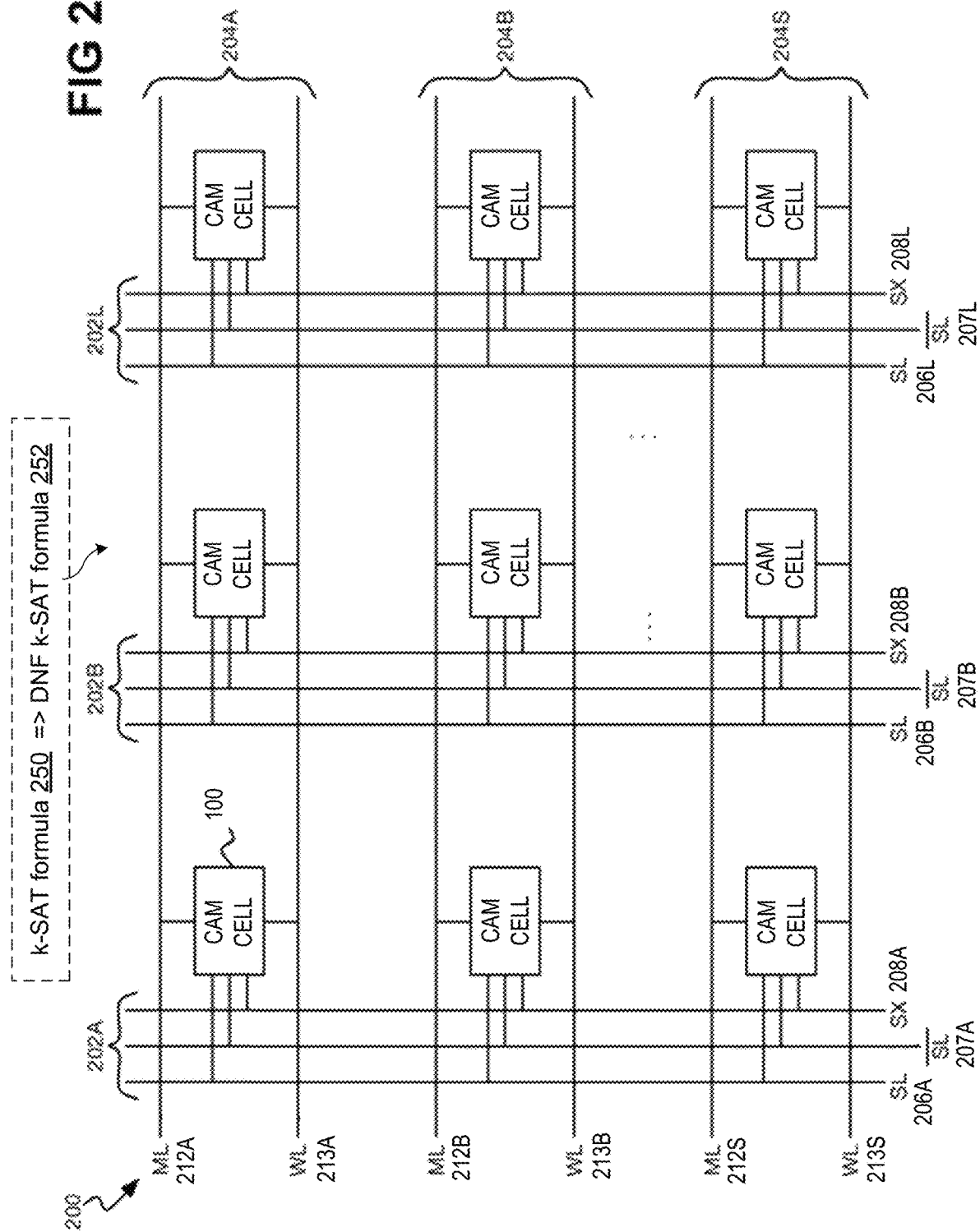

370 ⟶

| x | y | z | f | f̃ | ML1 | ML2 |
|---|---|---|---|---|-----|-----|
| 0 | 0 | 0 | 1 | 0 | 0 | 0 |
| 0 | 0 | 1 | 0 | 1 | 0 | 1 |
| 0 | 1 | 0 | 1 | 0 | 0 | 0 |
| 0 | 1 | 1 | 1 | 0 | 0 | 0 |
| 1 | 0 | 0 | 1 | 0 | 0 | 0 |
| 1 | 0 | 1 | 0 | 1 | 0 | 1 |
| 1 | 1 | 0 | 0 | 1 | 1 | 0 |
| 1 | 1 | 1 | 0 | 1 | 1 | 0 |

FIG. 3B

| d | q | p⊕r⊕s | q⊕r⊕s | (q⊕r⊕s)h | CC420 | LC430 | CC422 | LC432 | f |
|---|---|---|---|---|---|---|---|---|---|
| 0 | 0 | 0 | 0 | 1 | 0 | 1 | 1 | 0 | 0 |
| 0 | 0 | 1 | 1 | 0 | 1 | 0 | 2 | 1 | 0 |
| 0 | 1 | 0 | 0 | 1 | 1 | 0 | 2 | 1 | 0 |
| 0 | 0 | 0 | 1 | 0 | 2 | 1 | 1 | 0 | 0 |
| 1 | 1 | 1 | 0 | 1 | 0 | 0 | 2 | 1 | 0 |
| 1 | 1 | 0 | 1 | 1 | 1 | 0 | 3 | 0 | 1 |
| 0 | 1 | 1 | 0 | 1 | 1 | 0 | 1 | 0 | 1 |
| 0 | 0 | 0 | 1 | 0 | 2 | 1 | 2 | 1 | 0 |
| 1 | 0 | 1 | 0 | 1 | 1 | 0 | 1 | 0 | 1 |
| 1 | 1 | 0 | 1 | 0 | 2 | 1 | 2 | 1 | 0 |
| 1 | 1 | 1 | 0 | 1 | 3 | 0 | 1 | 0 | 0 |
| 1 | 0 | 0 | 1 | 1 | 1 | 1 | 2 | 0 | 0 |
| 1 | 1 | 0 | 1 | 1 | 2 | 1 | 3 | 0 | 0 |
| 1 | 1 | 1 | 0 | 0 | 2 | 1 | 1 | 0 | 0 |
| 1 | 1 | 1 | 1 | 0 | 3 | 0 | 2 | 1 | 0 |

COMPACT k-XOR-SAT FILTERING WITH CAMS

BACKGROUND

A Boolean satisfiability problem (i.e., a propositional satisfiability problem abbreviated as Satisfiability, SAT, or B-SAT) involves determining whether an interpretation exists to satisfy a Boolean formula (sometimes referred to herein as a Boolean satisfiability formula). For example, a SAT problem attempts to determine whether variables of a Boolean formula can be consistently replaced by the values True or False in such a way that the Boolean formula evaluates to True. If this is the case, the Boolean formula is called satisfiable. For example, the Boolean formula "a AND NOT b" is satisfiable because the values a=True and b=False would make the Boolean formula "a AND NOT b"=True. On the other hand, if the variables of the Boolean formula cannot be consistently replaced by the values True or False in such a way that the Boolean formula evaluates to True, the Boolean formula is unsatisfiable. For example, "a AND NOT a" is unsatisfiable.

Content addressable memory ("CAM") is a type of computing memory in which stored data is searched by its content rather than its location. When a "word" is input to a CAM, the CAM searches for the word in its contents. If the CAM finds the word (i.e., "returns a match"), the CAM returns the address of the location where the found word resides. Individual cells of a CAM (i.e., CAM cells) can be arranged into rows and columns. CAM cells of a common row may be connected along a common match line. Words can be stored along the rows of the CAM, and each CAM cell of a given row can store an entry of a stored word. When the CAM receives an input word (e.g., a series of voltage signals each representing an entry of the input word, sometimes referred to herein as an input vector), the CAM can search for the input word, by entry, along the columns of the CAM (i.e., a first entry of the input word can be searched down a first column of the CAM, a second entry of the input word can be searched down a second column of the CAM, etc.). The CAM can "find" the input word in a given row if all the CAM cells of the given row return a match for their respective entries of the input word.

BRIEF DESCRIPTION OF THE DRAWINGS

The present disclosure, in accordance with one or more various embodiments, is described in detail with reference to the following figures. The figures are provided for purposes of illustration only and merely depict examples.

FIG. 2 depicts an example CAM, in accordance with examples of the presently disclosed technology.

FIG. 3B depicts an example truth table for evaluating a k-SAT clause using the CAM of FIG. 3A, in accordance with examples of the presently disclosed technology.

FIG. 4B depicts an example truth table for evaluating a k-XOR-SAT formula using the CAM-based circuit of FIG. 4A, in accordance with examples of the presently disclosed technology.

Figure 1:
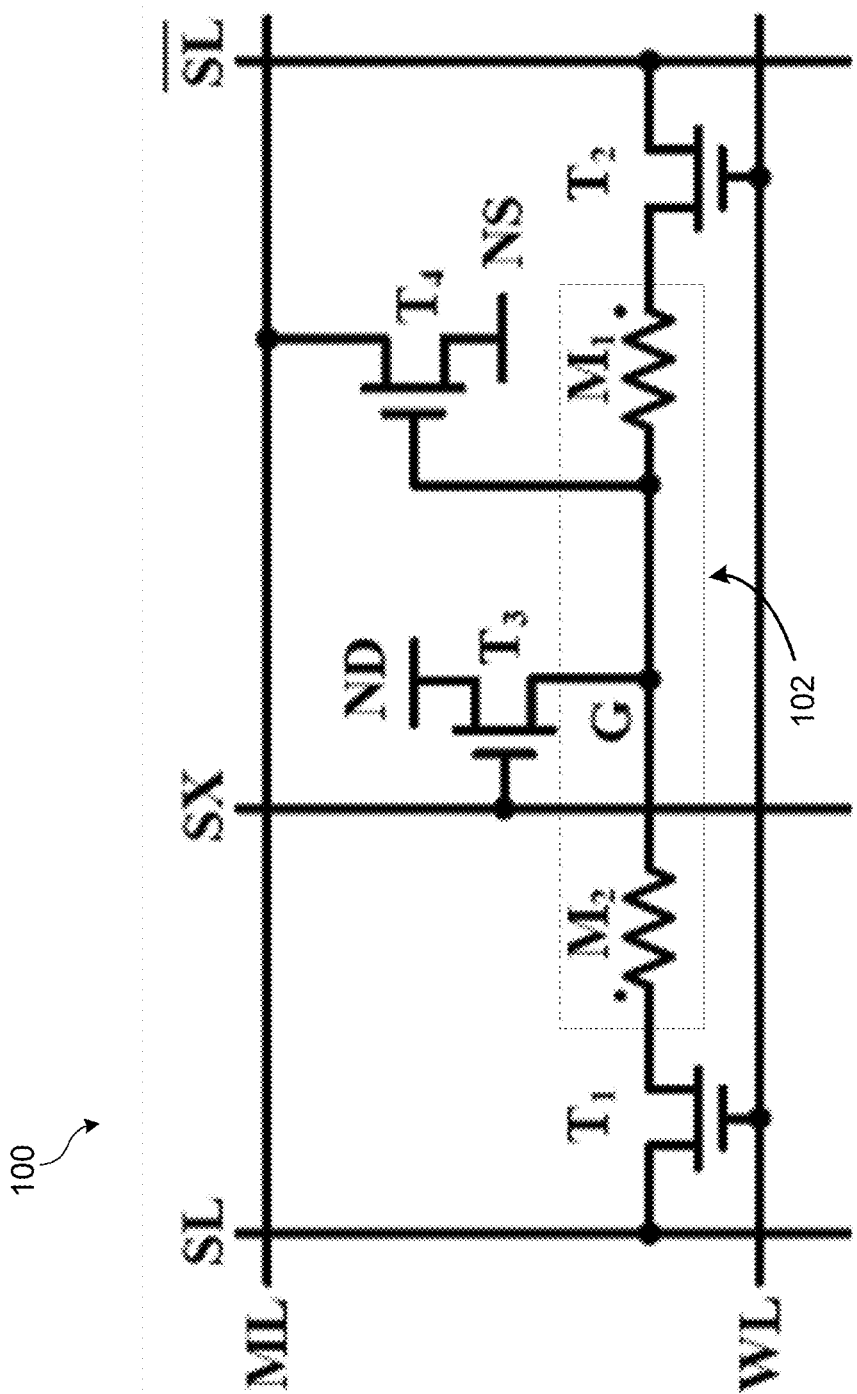
FIG. 1 depicts an example CAM cell, in accordance with examples of the presently disclosed technology.

The figures are not exhaustive and do not limit the present disclosure to the precise form disclosed.

DETAILED DESCRIPTION

A k-SAT problem is a type of SAT problem characterized by a number of variables V, a number of literals k, and a number of clauses C. A k-SAT clause generally comprises k literals. A literal of a k-SAT clause is either a variable or negation of a variable. Conjunctive normal form (CNF)—in particular with k=3 literals per k-SAT clause—is often considered the canonical representation for k-SAT formulas. In CNF, a k-SAT clause is a disjunction (i.e., logical OR operation) of literals, and a k-SAT formula is a conjunction (i.e., logical AND operation) of k-SAT clauses. A k-SAT formula can also be converted to a disjunctive normal form (DNF) where a k-SAT clause is a conjunction (i.e. logical AND operation) of literals, and the k-SAT formula is a disjunction (i.e. logical OR operation) of k-SAT clauses. k-SAT problems are non-deterministic polynomial-time (NP)-hard problems, and are among the first problems proved to be NP-complete. All problems in the NP-hard complexity class (which includes a wide range of natural decision and optimization problems) are at most as difficult to solve as k-SAT problems.

Because k-SAT problems are at the backbone of many industrial and scientific problems such as electronic design automation and cryptography, various hardware accelerators have been specially designed to implement (i.e., represent and evaluate) k-SAT problems. For example, certain Quadratic unconstrained binary optimization (QUBO)-based solvers, Ising machines, and CAMs have been specially designed to implement k-SAT problems. In the case of specially designed CAMs, clauses of a k-SAT problem/formula can be programmed to respective rows of a CAM, and each CAM cell of a given row can be programmed to represent a literal of a respective k-SAT clause. An input vector (e.g., representing a set of variables) can then be applied down the columns of the CAM to evaluate whether a set of variables represented by the input vector satisfy the k-SAT clauses programmed into the CAM.

While many industrial and scientific optimization problems can be formulated as k-SAT problems, certain optimization problems are better formulated in a different way. For example, some optimization problems such as low-density parity check (LDPC) in networking systems are best represented as k-exclusive OR-satisfaction (k-XOR-SAT) problems (i.e., Boolean satisfiability problems formulated using k-XOR-SAT clauses). Relatedly, certain optimization problems are best represented as "k-SAT-k-XOR-SAT hybrid problems" comprising a combination of k-SAT and k-XOR-SAT clauses.

Unlike a k-SAT clause which (in CNF) includes logical OR operations between constituent literals, a k-XOR-SAT clause includes logical XOR operations between its constituent literals. This seemingly minor distinction has a major impact on problem type/classification. For example, k-SAT problems (i.e., Boolean satisfiability problems formulated using k-SAT clauses) are NP-hard problems whereas k-XOR-SAT (i.e., Boolean satisfiability problems formulated using k-XOR-SAT clauses) are polynomial (P) problems. P problems can be solved in polynomial time, and are generally easier to represent and solve than NP-hard problems. Accordingly, representing a natively k-XOR-SAT optimization problem as a k-XOR-SAT problem instead of a k-SAT problem (or using k-XOR-SAT clauses instead of k-SAT clauses), can reduce complexity for the optimization problem.

Unfortunately, the above-described hardware accelerators specially designed to implement (i.e., represent and evaluate) k-SAT problems are generally unable to natively implement k-XOR-SAT clauses. Accordingly, implementing a k-XOR-SAT problem using these existing hardware accelerators typically involves reformulating the k-XOR-SAT problem as a k-SAT problem—which generally increases problem complexity (e.g., increases the number of variables involved), and moves evaluation of the k-XOR-SAT problem from polynomial time to non-polynomial time. Thus, reformulating the k-XOR-SAT problem as a k-SAT problem generally increases the amount of time, hardware, and power consumption required to implement the k-XOR-SAT problem. Relatedly, implementing a k-SAT-k-XOR-SAT hybrid problem (i.e., a problem formulated using a combination of k-SAT and k-XOR-SAT clauses) using these existing hardware accelerators typically involves reformulating constituent k-XOR-SAT clauses as k-SAT clauses. Again, such a reformulation can increase problem complexity—thereby increasing the amount of time, hardware, and power consumption required to implement the k-SAT-k-XOR-SAT hybrid problem.

Against this backdrop, examples of the presently disclosed technology provide CAM-based circuits specially constructed to implement Boolean satisfiability problems involving k-XOR-SAT clauses. With the strategic addition of auxiliary counting and logic circuits that evaluate match line voltage outputs of a CAM at k discrete times in order to determine whether a counted number of matches returned by a match line satisfies a pre-determine parity condition— where k represents a number of literals of a k-XOR-SAT clause of a Boolean satisfiability problem-a circuit of the present technology can leverage a common CAM (i.e., the same CAM) to implement the k-XOR-SAT clause and k-SAT clauses. Accordingly, this extremely versatile circuit can be used to implement k-XOR-SAT and k-SAT-k-XOR-SAT hybrid problems in less time, and with less hardware and power consumption than existing hardware accelerators.

A circuit of the presently disclosed technology may comprise: (1) a row of CAM cells programmed to store a k-XOR-SAT clause of a Boolean satisfiability problem; (2) a sense amplifier that, in response to an input vector being applied to the row of CAM cells, compares, at k discrete times, voltage output of a match line associated with the row of CAM cells to a threshold voltage, wherein k represents a number of literals of the k-XOR-SAT clause; (3) a counter circuit that counts a number of matches returned by the match line based on the k voltage comparisons of the sense amplifier (e.g., the counted number of matches may correspond with a number of the k voltage comparisons where the voltage output of the match line exceeded the threshold voltage); and (4) a logic circuit that outputs a signal indicating the input vector satisfies the k-XOR-SAT clause based on the counted number of matches satisfying a pre-determined parity condition (e.g., the counted number of matches comprising an odd number of matches). The row of CAM cells may comprise at least k literal-representing CAM cells. A literal-representing CAM cell of the k literal-representing CAM cells may be programmed to store a literal of the k-XOR-SAT clause.

In various examples, the literal-representing CAM cell may be programmed to store: (a) a first value when the literal is negated in the k-XOR-SAT clause; and (b) a second value when the literal is not negated in the k-XOR-SAT clause. As will be described in greater detail below, programming the literal-representing CAM cell to store the literal of the k-XOR-SAT clause may comprise programming conductance of one or more memristors included in the literal-representing CAM cell. As alluded to above, the circuit may be used to represent/evaluate a k-SAT clause of the Boolean satisfiability problem as well. In other words, the Boolean satisfiability problem may comprise a k-SAT-k-XOR-SAT hybrid problem. For example, the circuit may further comprise: (1) a second row of CAM cells programmed to store the k-SAT clause of the Boolean satisfiability problem; and (2) a processor that determines the input vector satisfies the Boolean satisfiability problem in response to receiving: (a) the signal indicating the input vector satisfies the k-XOR-SAT clause; and (b) a second signal indicating the input vector satisfies the k-SAT clause (such a signal may be based on a comparison between a threshold voltage and voltage of a match line associated with the second row of CAM cells).

As alluded to above, CAM-based circuits of the present technology present numerous advantages over existing hardware accelerators used to implement Boolean satisfiability problems.

For example, existing CAMs designed to implement k-SAT problems generally require reformulating k-XOR-SAT clauses as k-SAT clauses in order to implement k-XOR-SAT problems and/or k-SAT-k-XOR-SAT hybrid problems. Such reformulation can increase problem complexity, thereby increasing the amount of time, hardware, and power consumption required to represent and evaluate such problems. By contrast, with the strategic addition of auxiliary counting circuits and logic circuits that evaluate match line voltage outputs of a CAM at k discrete times in order to determine whether a counted number of matches returned by a match line satisfies a pre-determine parity condition— where k represents a number of literals of a k-XOR-SAT clause of a Boolean satisfiability problem—a CAM-based circuit of the present technology can leverage a common CAM to implement the k-XOR-SAT clause and k-SAT clauses. Accordingly, this extremely versatile circuit can be used to implement k-XOR-SAT and k-SAT-k-XOR-SAT hybrid problems in less time, and with less hardware and power consumption than existing CAMs.

Using a CAM-based circuit to implement k-XOR-SAT problems and/or k-SAT-k-XOR-SAT hybrid problems can also be more rapid/efficient than using other types of hardware accelerators (e.g., QUBO-based solvers and Ising machines). For example, leveraging the unique parallel search capabilities of CAMs, the presently disclosed circuits can evaluate an input vector against all (the potentially many) clauses of a Boolean satisfiability problem in a single search operation. In other words, for the CAM-based circuits of the presently disclosed technology, the amount of time required to evaluate a Boolean satisfiability problem remains generally constant even as the number of clauses (e.g., k-XOR-SAT clauses and/or k-SAT clauses) used to formulate the Boolean satisfiability problem increases. Accordingly, CAM-based circuits of the presently disclosed technology can evaluate large/complex Boolean satisfiability problems (i.e., Boolean satisfiability problems formulated using a large number of k-XOR-SAT clauses and/or k-SAT clauses) more quickly than other types of hardware accelerators (e.g., QUBO-based solvers and Ising machines) lacking this unique parallel search capability.

Examples of the presently disclosed technology will be described in greater detail with the following figures.

FIG. 1 depicts an example CAM cell 100, in accordance with examples of the presently disclosed technology. CAM cell 100 may be an example of a 4 transistor-2 memristor (4T2M) CAM cell that can be used in a CAM-based circuit of the presently disclosed technology. For example, CAM cell 100 may be programmed to represent a literal of a k-XOR-SAT clause or a k-SAT clause.

As depicted, CAM cell 100 comprises a switching transistor T1 connected to a data line SL and a switching transistor T2 connected to an inverted data line $\overline{SL}$. As alluded to above, the voltages across data line SL and inverted data line $\overline{SL}$ may correspond with a value/entry (e.g., a voltage signal) of an input vector applied to a CAM of which CAM cell 100 is a part. For example, voltage across data line SL may correspond with the value/entry of the input vector (e.g., a logical one) while the voltage across the inverted data line $\overline{SL}$ may correspond with a negated version of the value/entry of the input vector (e.g., a logical zero). A memristor M2 is connected to switching transistor T1 and a memristor M1 is connected to switching transistor T2. As depicted, gate terminals of switching transistors T1 and T2 are connected to a word line WL—which biases switching transistors T1 and T2. Immediately prior to and during a searching/matching operation, the voltage of word line WL may be increased above a threshold value, activating switching transistors T1 and T2. When switching transistor T1 is activated, switching transistor T1 may provide an electrical connection between data line SL and memristor M2. By contrast, when switching transistor T1 is not activated (i.e., when the voltage across word line WL is lower than the threshold value), data line SL and memristor M2 may be electrically disconnected. Likewise, when switching transistor T2 is activated, switching transistor T2 may provide an electrical connection between inverted data line $\overline{SL}$ and memristor M1. By contrast, when switching transistor T2 is not activated (i.e., when the voltage across word line WL is lower than the threshold value), inverted data line $\overline{SL}$ and memristor M1 may be electrically disconnected. Accordingly, the inclusion of switching transistors T1 and T2 can ensure that memristors M1 and M2 are disconnected from the data lines of CAM cell 100 when searching/matching operations are not being performed, which can reduce overall power consumption for CAM cell 100.

As depicted, memristors M1 and M2 are connected in series to form a resistive divider 102. The output voltage of resistive divider 102 (i.e., the voltage on common node G) is applied to a gate of a match line-transistor T4 to control activation of match-line transistor T4. When match line-transistor T4 is activated, it may discharge (i.e., "pull-down") voltage of match line ML. For example, if the voltage applied to the gate of match line-transistor T4 exceeds a threshold value, match line-transistor T4 will activate and discharge (i.e., "pull-down") the voltage across match line ML—returning a mismatch. By contrast, when the voltage applied to the gate of match line-transistor T4 is less than or equal to the threshold value, match line-transistor T4 may not activate. Accordingly, match line-transistor T4 will not discharge (i.e., "pull-down") the voltage across match line ML—thus returning a match. While in the specific example of FIG. 1, "pull-down" logic is described, it should be understood that in other examples CAM cell 100 may implement "pull-up" logic instead.

As alluded to above, CAM cell 100 can be programmed to store a literal of a k-XOR-SAT clause or a k-SAT clause by programming conductance of memristors M1 and M2. While the programmed conductances of memristors M1 and M2 will generally remain the same unless re-programmed, the output voltage of resistive divider 102 (i.e., the voltage on common node G) will change based on the value of the voltages received by memristors M2 and M1 from data line SL and inverted data line $\overline{SL}$ respectively. For example, memristors M1 and M2 can be programmed to a first conductance state (e.g., a logical zero conductance state—which may correspond with a negated literal) that causes the output voltage of the resistive divider to be high (e.g., exceed a threshold value) when the voltages received from data line SL and inverted data line $\overline{SL}$ represent a logical one—thus activating match line transistor T4 and returning a mismatch when the voltages across data line SL and inverted data line $\overline{SL}$ represent a logical one. By contrast, memristors M1 and M2 can be programmed to a second conductance state (e.g., a logical one conductance state—which may correspond with a non-negated literal) that causes the output voltage of the resistive divider to be high (e.g., exceed a threshold value) when the voltages received from data line SL and inverted data line $\overline{SL}$ represent a logical zero—thus activating match line transistor T4 and returning a mismatch when the voltages across data line SL and inverted data line $\overline{SL}$ represent a logical zero. As described in greater detail below, in various examples memristors M1 and M2 can be programmed to a third conductance state (e.g., a wildcard conductance state—which may correspond with a variable that is not included in a k-XOR-SAT or k-SAT clause) that causes the output voltage of the resistive divider to remain low (e.g., below a threshold value) regardless of whether the voltages received from data line SL and inverted data line $\overline{SL}$ represent a logical zero or a logical one—thus ensuring match line transistor T4 remains un-activated, and returns a match when the voltages across data line SL and inverted data line $\overline{SL}$ represent a logical zero or a logical one.

As depicted, a service line transistor T3 can work in concert with switching transistor T1 and/or switching transistor T2 to program conductances of memristors M1 and M2 using a service line SX.

It should be understood that CAM cell 100 is just one example of a CAM cell that may be included in a CAM-based circuit of the present technology. In general, any type of CAM cell that can be programmed to represent a literal of a k-XOR-SAT or k-SAT clause can be used. For instance, examples of the presently disclosed technology can utilize six transistor-two memristor (6T2M) CAM cells, 3 terminal CAM cells, 16 transistor (16T) ternary-CAM (TCAM) cells, etc.

FIG. 2 depicts an example CAM 200, in accordance with examples of the presently disclosed technology. CAM 200 may be programmed to represent a Boolean satisfiability problem such as a k-SAT problem, a k-XOR-SAT problem, or a k-SAT-k-XOR-SAT hybrid problem.

As described above, content addressable memory ("CAM") is a type of computing memory in which stored data is searched by its content rather than its location. When a "word" is input to a CAM, the CAM searches for the word in its contents. If the CAM finds the word (i.e., "returns a match"), the CAM returns the address of the location where the found word resides. Individual cells of a CAM (i.e., CAM cells) can be arranged into rows and columns. CAM cells of a common row may be connected along a common match line. Words can be stored along the rows of the CAM, and each CAM cell of a given row can store an entry of a stored word. When the CAM receives an input word (e.g., a series of voltage signals each representing an entry of the input word, sometimes referred to herein as an input vector), the CAM can search for the input word, by entry, along the columns of the CAM (i.e., a first entry of the input word can be searched down a first column of the CAM, a second entry of the input word can be searched down a second column of the CAM, etc.). The CAM can "find" the input word in a given row if all the CAM cells of the given row return a match for their respective entries of the input word.

Because k-SAT problems are at the backbone of many industrial and scientific problems such as electronic design automation and cryptography, various hardware accelerators have been specially designed to implement (i.e., represent and evaluate) k-SAT problems. For example, certain CAMs (e.g., CAM 200) have been specially designed to implement k-SAT problems. For example, clauses of a k-SAT problem/formula can be programmed to respective rows of CAM 200, and each CAM cell of a given row can be programmed to represent a literal of a respective k-SAT clause. An input vector (e.g., representing a set of variables) can then be applied down the columns of CAM 200 to evaluate whether a set of variables represented by the input vector satisfy the k-SAT clauses programmed into CAM 200.

As described above, while many industrial and scientific optimization problems can be formulated as k-SAT problems, certain optimization problems are better formulated in a different way. For example, some optimization problems such as low-density parity check (LDPC) in networking systems are best represented as k-k-XOR-SAT problems (i.e., Boolean satisfiability problems formulated using k-XOR-SAT clauses). Relatedly, certain optimization problems are best represented as "k-SAT-k-XOR-SAT hybrid problems" comprising a combination of k-SAT and k-XOR-SAT clauses.

Unlike a k-SAT clause which (in CNF) includes logical OR operations between constituent literals, a k-XOR-SAT clause includes logical XOR operations between its constituent literals. This seemingly minor distinction has a major impact on problem type/classification. For example, k-SAT problems (i.e., Boolean satisfiability problems formulated using k-SAT clauses) are NP-hard problems whereas k-XOR-SAT (i.e., Boolean satisfiability problems formulated using k-XOR-SAT clauses) are polynomial (P) problems. P problems can be solved in polynomial time, and are generally easier to represent and solve than NP-hard problems. Accordingly, representing a natively k-XOR-SAT optimization problem as a k-XOR-SAT problem instead of a k-SAT problem (or using k-XOR-SAT clauses instead of k-SAT clauses), can reduce complexity for the optimization problem.

Unfortunately, many hardware accelerators specially designed to implement (i.e., represent and evaluate) k-SAT problems (e.g., CAM 200) are generally unable to natively implement k-XOR-SAT clauses. Accordingly, implementing a k-XOR-SAT problem on CAM 200 using conventional techniques would typically involve reformulating the k-XOR-SAT problem as a k-SAT problem—which generally increases problem complexity (e.g., increases the number of variables involved), and moves evaluation of the k-XOR-SAT problem from polynomial time to non-polynomial time. Thus, reformulating the k-XOR-SAT problem as a k-SAT problem generally increases the amount of time, hardware, and power consumption required to implement the k-XOR-SAT problem. Relatedly, implementing a k-SAT-k-XOR-SAT hybrid problem (i.e., a problem formulated using a combination of k-SAT and k-XOR-SAT clauses) on CAM 200 using conventional techniques would typically involve reformulating constituent k-XOR-SAT clauses as k-SAT clauses. Again, such a reformulation can increase problem complexity—thereby increasing the amount of time, hardware, and power consumption required to implement the k-SAT-k-XOR-SAT hybrid problem.

To address the above-described drawbacks of conventional techniques/technologies, examples of the presently disclosed technology provide CAM-based circuits specially constructed to implement Boolean satisfiability problems involving k-XOR-SAT clauses. With the strategic addition of auxiliary counting and logic circuits that evaluate match line voltage outputs of a CAM at k discrete times in order to determine whether a counted number of matches returned by a match line satisfies a pre-determine parity condition—where k represents a number of literals of a k-XOR-SAT clause of a Boolean satisfiability problem—a circuit of the present technology can leverage a common CAM (i.e., the same CAM) to implement the k-XOR-SAT clause and k-SAT clauses. Accordingly, this extremely versatile circuit can be used to implement k-XOR-SAT and k-SAT-k-XOR-SAT hybrid problems in less time, and with less hardware and power consumption than existing hardware accelerators.

A circuit of the presently disclosed technology may comprise: (1) a row of CAM cells programmed to store a k-XOR-SAT clause of a Boolean satisfiability problem (e.g., a row of CAM 200); (2) a sense amplifier (not depicted in FIG. 2, but depicted in FIG. 4A) that, in response to an input vector being applied to the row of CAM cells, compares, at k discrete times, voltage output of a match line associated with the row of CAM cells to a threshold voltage, wherein k represents a number of literals of the k-XOR-SAT clause; (3) a counter circuit (not depicted in FIG. 2, but depicted in FIG. 4A) that counts a number of matches returned by the match line based on the k voltage comparisons of the sense amplifier (e.g., the counted number of matches may correspond with a number of the k voltage comparisons where the voltage output of the match line exceeded the threshold voltage); and (4) a logic circuit (not depicted in FIG. 2, but depicted in FIG. 4A) that outputs a signal indicating the input vector satisfies the k-XOR-SAT clause based on the counted number of matches satisfying a pre-determined parity condition (e.g., the counted number of matches comprising an odd number of matches). The row of CAM cells may comprise at least k literal-representing CAM cells. A literal-representing CAM cell (e.g., CAM cell 100 of FIG. 2) of the k literal-representing CAM cells may be programmed to store a literal of the k-XOR-SAT clause.

In various examples, the literal-representing CAM cell may be programmed to store: (a) a first value when the literal is negated in the k-XOR-SAT clause (e.g., a logical zero); and (b) a second value when the literal is not negated in the k-XOR-SAT clause (e.g., a logical one). As will be described in greater detail below, programming the literal-representing CAM cell to store the literal of the k-XOR-SAT clause may comprise programming conductance of one or more memristors included in the literal-representing CAM cell (e.g., programming conductances of memristors M1 and M2 of CAM cell 100). As alluded to above, the circuit may be used to implement a k-SAT clause of the Boolean satisfiability problem as well. In other words, the Boolean satisfiability problem may comprise a k-SAT-k-XOR-SAT hybrid problem. For example, the circuit may further comprise: (1) a second row of CAM cells (e.g., a second row of CAM 200)

programmed to store the k-SAT clause of the Boolean satisfiability problem; and (2) a processor (not depicted) that determines the input vector satisfies the Boolean satisfiability problem in response to receiving: (a) the signal indicating the input vector satisfies the k-XOR-SAT clause; and (b) a second signal indicating the input vector satisfies the k-SAT clause (such a signal may be based on a comparison between a threshold voltage and voltage of a match line associated with the second row of CAM cells).

Referring again to FIG. 2, certain CAMs (e.g., CAM 200) can be categorized as "ternary." A ternary CAM ("TCAM") can evaluate input vectors containing binary bits of zero, one, and/or wildcard values against TCAM cells that store/represent bits of either zero, one, or a wildcard value (as alluded to above, a wildcard value is sometimes referred to as a "don't care" or "always match" value). For example, and as alluded to above, one or more memristors of a TCAM cell can be programmed to a first conductance state (e.g., a logical zero) that returns a match when a voltage signal representing a logical zero, or a wildcard value is applied to the TCAM cell. By contrast, the one or more memristors of the TCAM cell can be programmed to a second conductance state (e.g., a logical one) that returns a match when a voltage signal representing a logical one, or a wildcard value, is applied to the TCAM cell. Additionally, the one or more memristors of the TCAM cell can be programmed to a third conductance state (e.g., a wildcard conductance state) that returns a match when a voltage signal representing a logical zero, one, or a wildcard value is applied to the TCAM cell. In various implementations CAM 200 may comprise a TCAM. However, in other implementations, CAM 200 may comprise higher order CAMs (e.g., a quaternary CAM ("QCAM"), an analog CAM ("aCAM"), etc.).

As depicted, CAM 200 includes columns 202A, 202B, . . . 202L. The number of columns of CAM 200 may be equal to the number of variables V within a total set of variables $x_1, x_2, \ldots, x_L$, to which a Boolean satisfiability formula can be set, either identically or as a negative thereof. Accordingly, the columns of CAM 200 respectively may correspond to the variables $x_1, x_2, \ldots, x_L$.

CAM 200 also includes rows 204A, 204B, . . . 204S. The number of rows of CAM 200 may be equal to the number of clauses S (e.g., k-XOR-SAT clauses and/or k-SAT clauses) which compose the Boolean satisfiability formula. As depicted, CAM cells of each row may be connected to a common match line. For example, the CAM cells of row 204A are connected to match line 212A, the CAM cells of row 204B are connected to match line 212B, the CAM cells of row 204S are connected to match line 212S, and so on. As alluded to above, CAM 200 may be an "AND"-type CAM that performs a logical AND operation between CAM cells of a common row.

As depicted, CAM cells of a common row may be connected to a common word line as well. For example, the CAM cells of row 204A are connected to word line 213A, the CAM cells of row 204B are connected to word line 213B, the CAM cells of row 204S are connected to word line 213S, and so on. As alluded to above, the word lines of CAM 200 can bias switching transistors of constituent CAM cells such that memristors of the constituent CAM cells are only electrically connected to data lines/inverted data lines of CAM 200 immediately prior to and during matching/searching operations—which can reduce power consumption for CAM 200.

As depicted, each column of CAM 200 includes a data line (e.g., SL 206A for column 202A, SL 206B for column 202B, SL 206L for column 202L, and so on) and an inverted data line (e.g., $\overline{SL}$ 207A for column 202A, $\overline{SL}$ 207B for column 202B, $\overline{SL}$ 207L for column 202L, and so on). Each column may also include a service line (e.g., SX 208A for column 202A, SX 208B for column 202B, SX 208L for column 202L, and so on) for programming CAM cells.

As alluded to above, CAM 200 can be programmed to implement (i.e., represent and evaluate) both k-SAT clauses and k-XOR-SAT clauses of a Boolean satisfiability problem. For illustration, exemplary implementation of a k-SAT formula 250 will be described in the paragraphs below, including in conjunction with FIGS. 3A-3B. As alluded to above, implementation of k-SAT clauses on CAM 200 may not require the auxiliary counting and logic circuits that examples of the presently disclosed technology utilize to implement k-XOR-SAT clauses on CAM-based circuits.

As described above, the canonical representation for k-SAT formula 250 may be in conjunctive normal form (CNF). However, k-SAT formula 250 can also be converted to disjunctive normal form (DNF) where: (1) a DNF k-SAT formula 252 (i.e., k-SAT formula 250 converted to DNF) is a disjunction (i.e., logical OR operation) of DNF k-SAT clauses; (2) each DNF k-SAT clause (i.e., k-SAT clause converted to DNF) is a conjunction (i.e., logical AND operation) of literals; and (3) the literals of a respective DNF k-SAT clause are negated versions of the literals of a corresponding k-SAT clause in CNF. For example, if k-SAT formula 250 is represented as $f=(\neg x \lor \neg y) \land (y \lor \neg z)$ in CNF, DNF k-SAT formula 252 may be represented as $\bar{f}=(x \land y) \lor (\neg y \land z)$. As alluded to above, DNF may be naturally mapped to an AND type CAM (e.g., CAM 200) where literals of a DNF k-SAT clause are programmed to individual CAM cells of a respective row.

For example, a DNF k-SAT clause of DNF-k-SAT formula 252 can be programmed into row 204A by programming the CAM cells of row 204A to correspond with the variable assignments of the DNF k-SAT clause. Here, the DNF k-SAT clause programmed to row 204A may comprise the first clause of DNF-k-SAT formula 252. As alluded to above, the columns of CAM 200 may correspond with the total number of V variables of the DNF-k-SAT clause. For example, column 202B can correspond to the second variable $x_2$ of the total set of V variables $x_1, x_2, \ldots, x_V$, and thus to the variable assignment corresponding to variable $x_2$.

Each DNF k-SAT clause of DNF k-SAT formula 252 can be programmed to a respective row of CAM 200 according to a mapping order. Thus, the inherent AND properties of CAM 200 can be used to solve DNF k-SAT formula 252—and by extension, k-SAT formula 250. For example, because (1) DNF k-SAT formula 252 includes a plurality of DNF k-SAT clauses connected by logical ORs and (2) each DNF k-SAT clause comprises a plurality of literals connected by logical ANDs—the DNF k-SAT clauses of DNF k-SAT formula 252 can be separated into respective rows of CAM 200 without disturbing DNF k-SAT formula 252. Once DNF k-SAT formula 252 is mapped into rows, each variable within the row can be arranged in a column, so that a guess (i.e., an input vector) can be applied to each variable via each column.

Figure 3A:
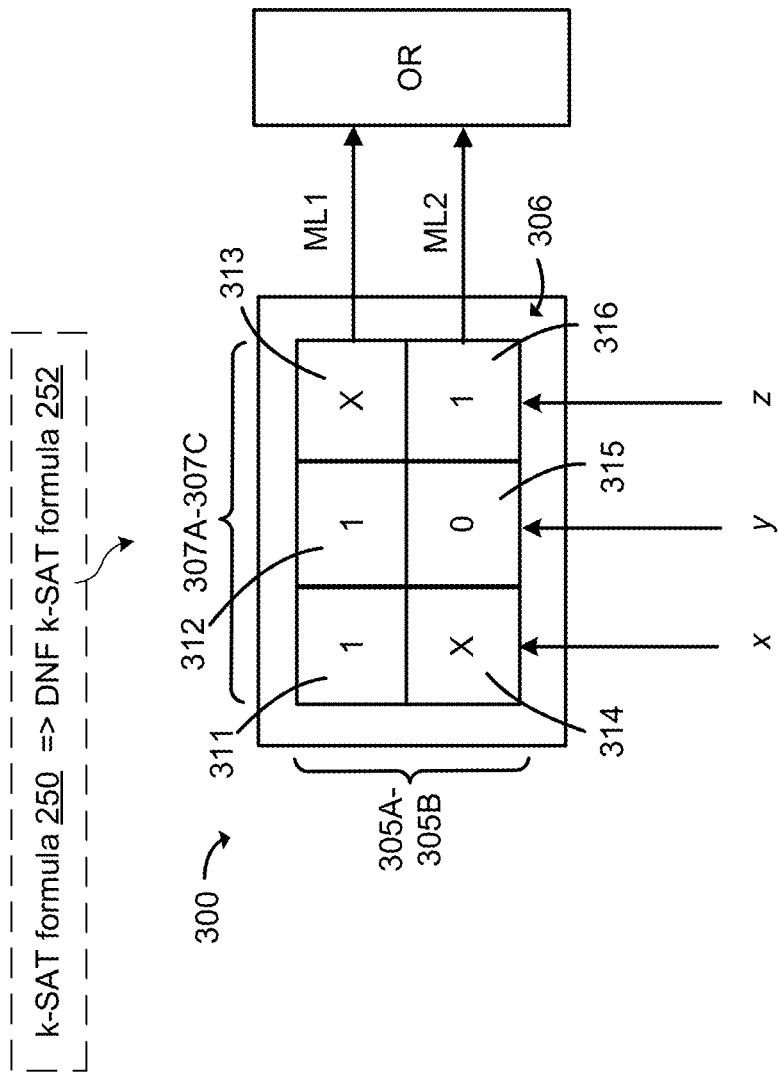
FIG. 3A depicts another example CAM, in accordance with examples of the presently disclosed technology.

As seen in FIG. 3A, an example CAM 300 (which may have the same/similar construction as CAM 200) includes a plurality of columns 307 and rows 305. Each DNF k-SAT clause of DNF k-SAT formula 252 can be mapped onto a row 305 of the plurality of CAM cells 306 according to a mapping order. In one implementation, the mapping order includes programming a first DNF k-SAT clause that includes a plurality of literals onto a first row 305A, and programming a second DNF k-SAT clause that includes a plurality of literals onto a second row 305B. Each of the plurality of literals may further include a first value assigned to each non-negated literal (e.g., z), and a second value assigned to each negated literal (e.g., ¬z).

In the specific example of FIG. 3A, k-SAT formula 250 (and by extension, DNF k-SAT formula 252) comprises an exemplary 2-SAT formula that includes two literals (i.e., k=2), three variables (i.e., V=3) and two k-SAT clauses (i.e., C=2). In this example, CAM 300 comprises an array of CAM cells that include two rows and three columns. Each DNF k-SAT clause of DNF k-SAT formula 252 is mapped to a row of CAM 300. For example, a first DNF k-SAT clause is mapped to first row 305A, and a second DNF k-SAT clause is mapped to second row 305B. Furthermore, each column of CAM 300 includes a variable (e.g., 1, 0, or a wildcard value ("X")). Each DNF k-SAT clause has k literals chosen between the V variables. In this example, each DNF k-SAT clause includes two literals. Non-negated literals are programmed as 1 in their corresponding CAM cells and negated literals are programmed as 0 in their corresponding CAM cells. Variables not presented in a DNF k-SAT clause are programmed as 'X' (i.e., a wildcard value) in their corresponding CAM cells.

As alluded to above, k-SAT formula 250 may be represented as follows in CNF: $f=(\neg x \lor \neg y) \land (y \lor \neg z)$. k-SAT formula 250 can then be converted to DNF as follows: $\bar{f}=(x \land y) \lor (\neg y \land z)$. This DNF k-SAT formula 252 can be programmed (i.e., mapped) onto CAM 300. In this example, the first DNF k-SAT clause $(x \land y)$ is programmed to first row 305A, and the second DNF k-SAT clause $(\neg y \land z)$ is programmed to second row 305B. Each literal within each DNF k-SAT clause is mapped to its own respective column 307A-C. For example, x is mapped to the first column 307A, y is mapped to the second column 307B, and z is mapped to the third column 307C. Furthermore, each literal is assigned a bit value (ternary 0 or 1 or "X") depending on whether the literal is a negated literal, a non-negated literal, or an absent literal in a respective DNF k-SAT clause. Here, a negated literal may be assigned a bit value of 0, a non-negated literal may be assigned a bit value of 1, and an absent literal may be assigned a bit value of 'X' (i.e., a wildcard value). For example, the first DNF k-SAT clause includes the literals x, y. The values of x, y are programmed to CAM 300 such that x is represented in cell 311 as a 1, y is represented in cell 312 as 1, and z is represented in cell 313 as a "X". As seen further in FIG. 3A, the second DNF k-SAT clause $(\neg y \land z)$ is programmed to the second row 305 of CAM 300, such that x is represented in cell 314 as "X", ¬y is represented in cell 315 as "0", and z is represented in cell 316 as a "1". Thus, the first DNF k-SAT clause $(x \land y)$ of the DNF k-SAT expression $\bar{f}=(x \land y) \lor (\neg y \land z)$ is represented as 1 1 X in the first row, and the second DNF k-SAT clause $(\neg y \land z)$ is represented as X 0 1 in the second row.

As depicted in FIG. 3A, each row includes a match line. For example, the cells 311-313 in the first row 305A are connected to a first match line ML1, and the cells 314-316 in the second row 305B are connected to a second match line ML2.

As alluded to above, a circuit of the presently disclosed technology can apply each entry (representing a variable) of an input vector (representing a set of variables being evaluated against a Boolean satisfiability problem) to each column of a CAM in parallel to determine which clauses of a Boolean satisfiability problem are satisfied. In the specific example of FIG. 3A, because k-SAT clauses are programmed to CAM 300 in DNF, a satisfied DNF k-SAT clause (e.g., corresponding with a match line output of 1) may correspond with an un-satisfied CNF k-SAT clause (and vice versa). For example, if the first DNF k-SAT clause $(x \land y)$ of DNF k-SAT formula 252 is satisfied, the corresponding first CNF k-SAT clause $(\neg x \lor \neg y)$ of k-SAT formula 250 may not be satisfied (and vice versa). For instance, as seen in FIG. 3A, if an input vector [1 1 0] is applied to CAM 300, match line ML1 would return a high voltage value (e.g., a high order bit value 1). Here, match line ML1 would return a high voltage value because each variable of the input vector (i.e., input values/entries) matched the values stored in cell 311, 312 and 313 respectively. In addition, match line ML2 would return a low voltage value (e.g., low order bit value 0) since the input vector [1 1 0] mismatched the values stored in cells 314, 315 and 316. Thus, the first CNF k-SAT clause (i.e., the original first k-SAT clause in CNF) is not satisfied because the corresponding first DNF k-SAT clause is satisfied, while the second CNF k-SAT clause (i.e., the original second k-SAT clause in CNF) is satisfied because the corresponding second DNF k-SAT clause is not satisfied. By contrast, if an input vector [0 0 0] is applied to CAM 300, ML1 and ML2 would return a ML low value (e.g, a low order bit value 0) since the input vector mismatched the value stored in cells 311, 312, 313, 314, 315 and 316. Since both match lines ML1 and ML2 return a low value, both original CNF k-SAT clauses (i.e., both k-SAT clauses of the Boolean satisfiability formula in CNF) are satisfied because the two DNF k-SAT clauses are not satisfied.

A truth table 370 for k-SAT formula 250 is depicted in FIG. 3B. k-SAT formula 250 is solved when $\bar{f}=0$ ($f=1$). Each row can be coupled to an OR gate to verify if that k-SAT formula 250 is satisfied.

In an alternative embodiment, analog values of each match line can be passed through an analog adder. The analog adder may combine the analog values (i.e., non-binary signals) of each match line to calculate a sum value. The sum of the analog values may be returned as an output that can be used to solve the Boolean satisfiability formula.

Figure 4A:
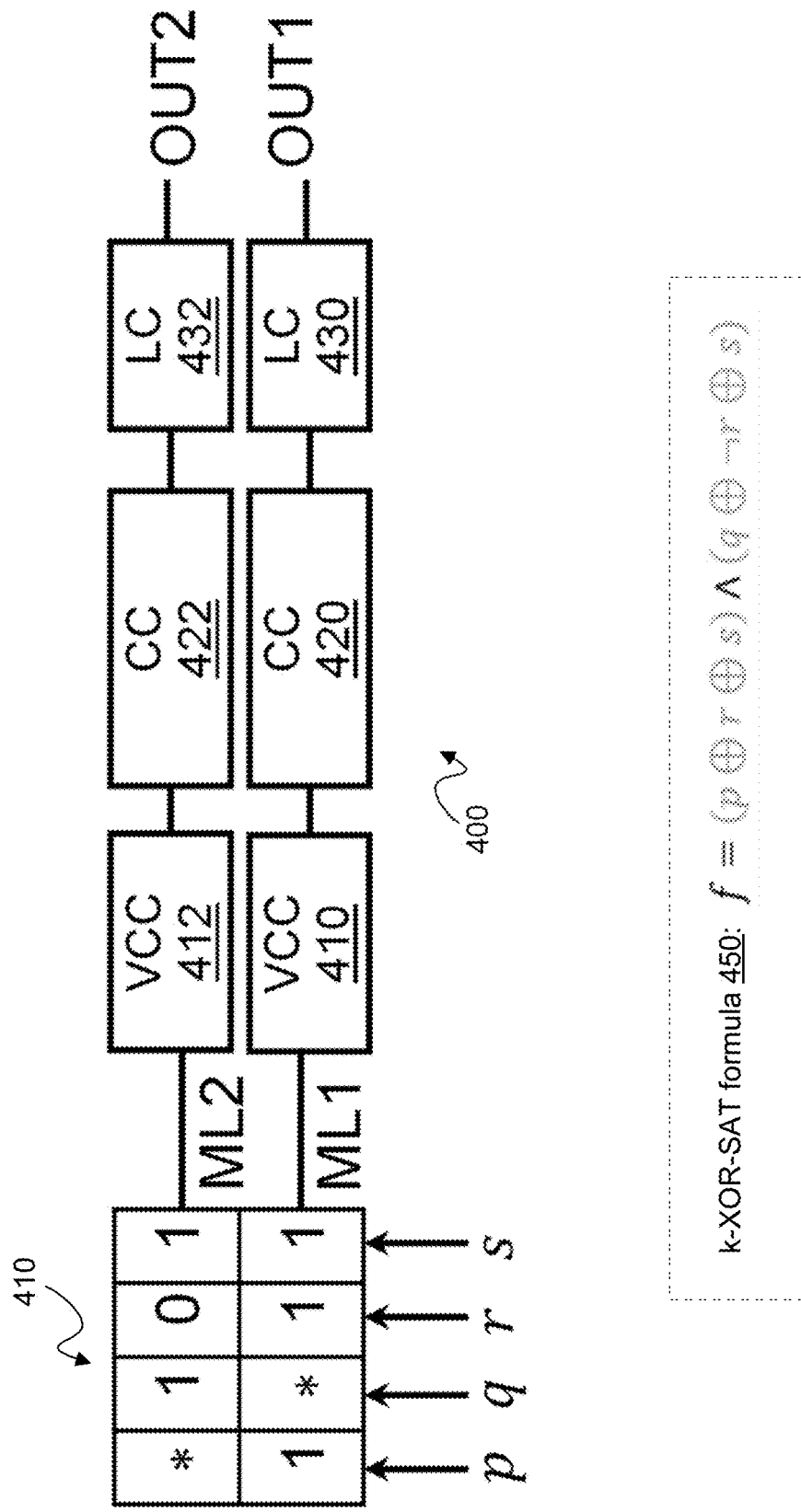
FIG. 4A depicts an example CAM-based circuit for implementing k-XOR-SAT clauses, in accordance with examples of the presently disclosed technology.

FIG. 4A depicts an example CAM-based circuit 400 for implementing k-XOR-SAT clauses, in accordance with various examples of the presently disclosed technology. Before describing CAM-based circuit 400 in more detail, some background on k-XOR-SAT problems/clauses may be instructive. As alluded to above, unlike a k-SAT clause which (in CNF) includes logical OR operations between constituent literals, a k-XOR-SAT clause includes logical XOR operations between its constituent literals. This seemingly minor distinction has a major impact on problem type/classification. For example, k-SAT problems (i.e., Boolean satisfiability problems formulated using k-SAT clauses) are NP-hard problems whereas k-XOR-SAT (i.e., Boolean satisfiability problems formulated using k-XOR-SAT clauses) are polynomial (P) problems. P problems can be solved in polynomial time, and are generally easier to represent and solve than NP-hard problems. Accordingly, representing a natively k-XOR-SAT optimization problem as a k-XOR-SAT problem instead of a k-SAT problem (or using k-XOR-SAT clauses instead of k-SAT clauses), can reduce complexity for the optimization problem.

A k-XOR-SAT formula can be viewed as a system of linear equations of modulo 2 and can be solved in polynomial time (e.g., $O(V^3)$). In other words, if the k-XOR-SAT formula includes V variables, it may take $O(V^3)$ iterations to solve the k-XOR-SAT formula.

An example k-XOR-SAT formula 450 may comprise $f=(p \oplus r \oplus s) \land (q \oplus \neg r \oplus s)$. Here, k-XOR-SAT formula 450 includes four variables (i.e., p, q, r, s), two k-XOR-SAT clauses (i.e., (p⊕r⊕s) and ∧(q⊕¬r⊕s)), and three literals per k-XOR-SAT clause. Because the XOR operation effectively performs an inverse parity check, an input vector (or more specifically, the variable assignments represented by the input vector) may satisfy a respective k-XOR-SAT clause if a number of matches between the input vector and the literals of the k-XOR-SAT clause satisfies a pre-determined parity condition. For example, if the input vector matches an odd number of literals of a k-XOR-SAT clause, the input vector may satisfy the k-XOR-SAT clause. By contrast, if the input vector matches an even number of literals of the k-XOR-SAT clause, the input vector may violate the k-XOR-SAT clause. As alluded to above, k-XOR-SAT formula 450 is satisfied when both of its constituent k-XOR-SAT clauses are satisfied. k-XOR-SAT formula 450 is not satisfied when at least one of its constituent k-XOR-SAT clauses is not satisfied.

Referring again to FIG. 4A, CAM-based circuit 400 includes a CAM 410. In certain implementations, the constituent CAM cells of CAM 410 may have the same/similar construction as CAM cell 100 of FIG. 1—although this need not be the case. In general, any CAM cell capable of being programmed to two possible values (e.g., a logical one or a logical zero) can be utilized in CAM 410.

As depicted, CAM 410 includes a bottom row of CAM cells and a top row of CAM cells. The bottom row of CAM cells is associated with a first match line ML1 and the top row of CAM cells is associated with a second match line ML2. As described in greater detail below, the bottom row of CAM cells is programmed to store the first k-XOR-SAT clause of k-XOR-SAT formula 450 (i.e., (p⊕r⊕s)) and the top row of CAM cells is programmed to store the second k-XOR-SAT clause of k-XOR-SAT formula 450 (i.e., (q⊕¬r⊕s)). While in the specific implementation of FIG. 4A, CAM 410 includes two rows (i.e., one row for each clause of k-XOR-SAT formula 450), in other implementations CAM 410 may include a different number of rows. For example, if CAM-based circuit 400 is used to implement an arbitrary Boolean satisfiability problem (e.g., including one or more k-XOR-SAT clauses), the number of rows of CAM 410 may be equivalent to the number of clauses of the Boolean satisfiability problem.

CAM 410 also includes four columns—and accordingly each row of CAM 410 includes four CAM cells. As depicted, the first column (i.e., the leftmost column) of CAM 410 is associated with the variable p of k-XOR-SAT formula 450. The second column of CAM 410 is associated with the variable q of k-XOR-SAT formula 450, the third column of CAM 410 is associated with the variable r of k-XOR-SAT formula 450, and the fourth column of CAM 410 is associated with the variable s of k-XOR-SAT formula 450. Accordingly, when an input vector is applied to CAM 410 a first entry (e.g., a first voltage signal) of the input vector associated with the variable p may be applied to the first column of CAM 410, a second entry (e.g., a second voltage signal) of the input vector associated with the variable q may be applied to the second column of CAM 410, a third entry (e.g., a third voltage signal) of the input vector associated with the variable r may be applied to the third column of CAM 410, and a fourth entry (e.g., a fourth voltage signal) of the input vector associated with the variable s may be applied to the fourth column of CAM 410. While in the specific implementation of FIG. 4A CAM 410 includes four columns (i.e., one column for each variable of k-XOR-SAT formula 450), in other implementations CAM 410 may include a different number of columns. For example, if CAM-based circuit 400 is used to implement an arbitrary Boolean satisfiability problem (e.g., including one or more k-XOR-SAT clauses), the number of columns of CAM 410 may be equivalent to the number variables in the Boolean satisfiability problem.

As alluded to above, the bottom row of CAM 410 is programmed to store the first k-XOR-SAT clause of k-XOR-SAT formula 450 (i.e., (p⊕r⊕s)). In the specification example of FIG. 4A, a logical one is used to represent literals/variables which are not negated in a clause, a logical zero is used to represent literals/variables which are negated in a clause, and a wildcard value (i.e., "X") is used represent variables which do not appear in a k-XOR-SAT clause. Accordingly, because the variable q is not included in the first k-XOR-SAT clause of k-XOR-SAT formula 450, the second CAM cell of the bottom row is programmed to a wildcard value that always returns a match. This ensures that the second CAM cell of the bottom row does not disrupt evaluation of the first k-XOR-SAT clause of k-XOR-SAT formula 450. The first, third, and fourth CAM cells of the bottom row may be referred to as literal-representing CAM cells as they are programmed to store literals of the first k-XOR-SAT clause of k-XOR-SAT formula 450. By contrast, the second CAM cell of the bottom row may be referred to as a non-literal-representing CAM cell as it is programmed to a wildcard value to account for the fact that the first k-XOR-SAT clause of k-XOR-SAT formula 450 does not include the variable q.

The top row of CAM 410 is programmed to store the second k-XOR-SAT clause of k-XOR-SAT formula 450 (i.e., (q⊕¬r⊕s)) in the same/similar manner. As depicted, the second-fourth CAM cells of the top row are literal-representing CAM cells, whereas the first CAM cell of the top row is a non-literal representing CAM cell programmed to a wildcard value to account for the fact that the second k-XOR-SAT clause of k-XOR-SAT formula 450 does not include the variable p.

CAM-based circuit 400 also includes auxiliary circuits connected to the first match line ML1 and the second match line ML2 respectively. As alluded to above (and as described in greater detail below), these auxiliary circuits enable CAM-based circuit 400 to implement k-XOR-SAT clauses utilizing the same CAM hardware (e.g., CAM 410) used to implement k-SAT clauses.

As described above, unlike a k-SAT clause which (in CNF) includes logical OR operations between constituent literals, a k-XOR-SAT clause includes logical XOR operations between its constituent literals. Because the XOR operation effectively performs an inverse parity check, an input vector (or more specifically, a set of variable assignments represented by the input vector) may satisfy a respective k-XOR-SAT clause if a number of matches between the input vector and the literals of the k-XOR-SAT clause satisfies a pre-determined parity condition. For example, if the input vector matches an odd number of literals of a k-XOR-SAT clause, the input vector may satisfy the k-XOR-SAT clause.

As examples of the presently disclosed technology are designed in appreciation of, voltage of a match line generally decays at different rates depending on a number of mismatches returned by CAM cells connected to the match line (in various implementations, this may be equivalent to a Hamming distance between an input vector and a stored word). Namely, voltage of the match line will generally decay faster as the number of mismatches increases. Said differently, the voltage of the match line will generally decay slower as the number of matches increases relative to the number of mismatches. Based on this insight, examples of the presently disclosed technology can count a number of matches (or conversely a number of mismatches) returned by CAM cells connected to a match line based on the rate of decay of match line voltage. For instance, examples can compare the match line voltage to a threshold voltage at multiple discrete times (e.g., at intervals of 0.25 a.u. seconds) to count the number of matches returned by the match line. For instance, the number of matches returned by the match line may correspond with a number of the above-described comparisons where the match line voltage exceeded the threshold voltage.

Figure 5:
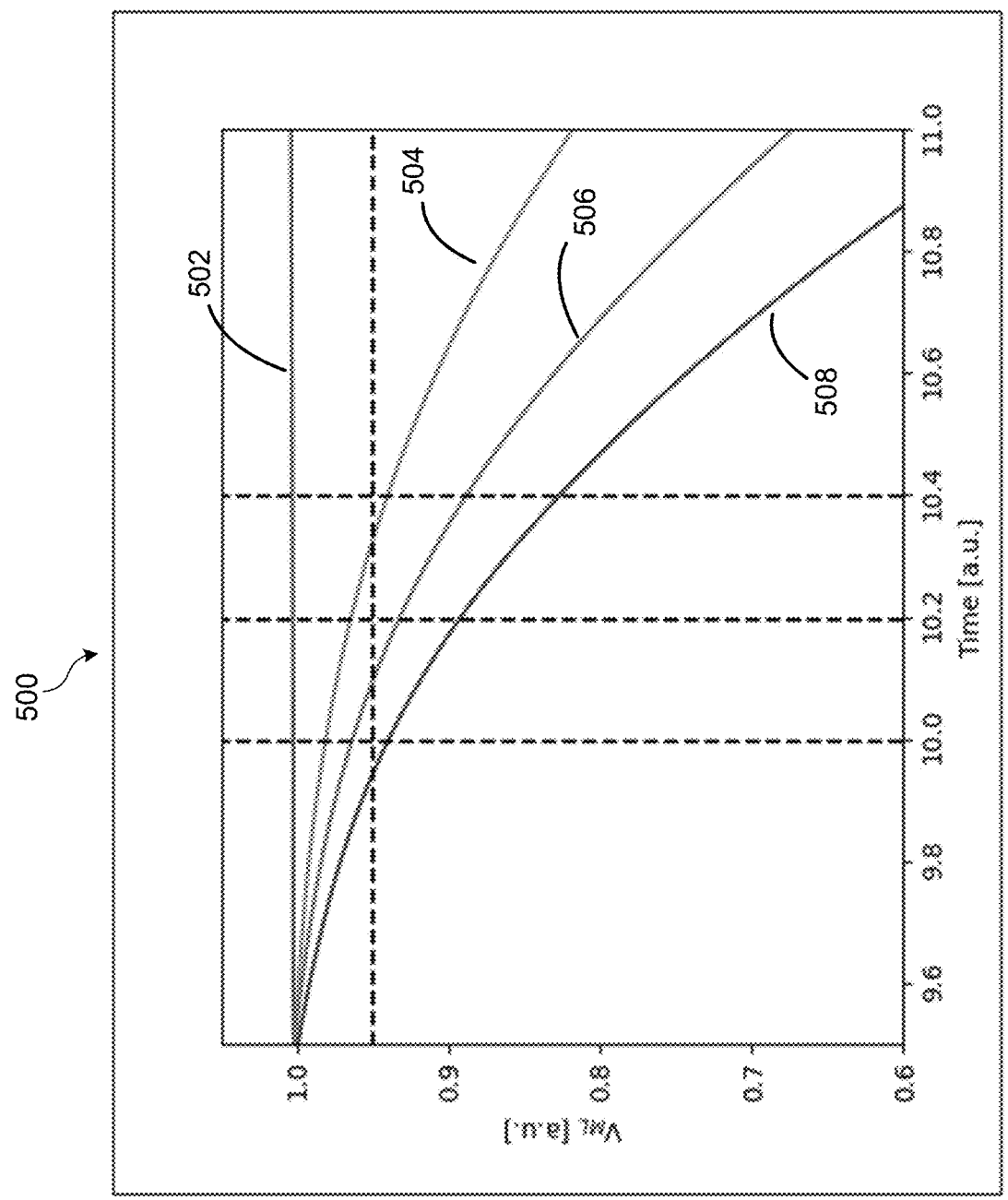
FIG. 5 depicts an example graph illustrating comparisons between a threshold voltage and voltage output of a match line associated with a row of CAM cells programmed to store a k-XOR-SAT clause, in accordance with examples of the presently disclosed technology.

Combining the above-described insights with the programming of k-XOR-SAT clauses to rows of a CAM, examples can count a number of matches between an input vector and a k-XOR-SAT clause comprising k literals by: (1) comparing, at k discrete times (e.g., at intervals of 0.25 a.u. seconds), a threshold voltage to voltage of a match line associated with a row of CAM cells programmed to store the k-XOR-SAT clause; and (2) counting a number of matches returned by the match line based on the k voltage comparisons (e.g., a number of comparisons where the match line voltage exceeded the threshold voltage). For concept illustration, FIG. 5 depicts an example graph 500 illustrating comparisons between a threshold voltage and voltage output of a match line associated with a row of CAM cells programmed to store a k-XOR-SAT clause comprising k=3 literals. As depicted, the threshold voltage is 0.9 a.u. volts and the match line voltage is compared to the threshold voltage at three discrete times: t=10.00 a.u., seconds; t=10.25 a.u., seconds; and t=10.50 a.u., seconds. If the match line returns three matches (as illustrated by curve 502), the match line voltage will exceed the threshold voltage three times. If the match line returns two matches (as illustrated by curve 504), the match line voltage will exceed the threshold voltage two times. If the match line returns one match (as illustrated by curve 506), the match line voltage will exceed the threshold voltage one time. If the match line returns zero matches (as illustrated by curve 508), the match line voltage will exceed the threshold voltage zero times. Here, the threshold voltage and the sensing/comparison times may be strategically selected to fit such a relationship.

Referring again to FIG. 4A, CAM 400 includes auxiliary voltage comparison, counting, and logic circuits that implement the above-described methodology. For example, sense amplifier 410 is electrically connected to the first match line ML1 which is associated with the bottom row of CAM 410. Accordingly, sense amplifier 410 can receive voltage output of the first match line ML1 and compare the voltage output of the first match line ML1 to a threshold voltage at k=3 discrete times.

As depicted, counter circuit 420 is electrically connected to sense amplifier 410, and accordingly receives outputs from sense amplifier 410. Based on the outputs from sense amplifier 410, counter circuit 420 can count the number of matches returned by the first match line ML1 (e.g., count a number of comparisons where the voltage of the first match line ML1 exceeded the threshold voltage).

As depicted, logic circuit 430 is electrically connected to counter circuit 420, and accordingly receives outputs from counter circuit 420. Based on the outputs from counter circuit 420, logic circuit 430 can determine whether the counted number of matches satisfies a pre-determined parity condition (e.g., an odd number of matches) and output a signal indicating whether the input vector satisfies or violates the k-XOR-SAT clause programmed to the bottom row of CAM cells (i.e., $(p \oplus r \oplus s)$).

Similarly, sense amplifier 412 is electrically connected to the second match line ML2 which is associated with the top row of CAM 410. Accordingly, sense amplifier 412 can receive voltage output of the second match line ML2 and compare the voltage output of the second match line ML2 to the threshold voltage at k=3 discrete times.

As depicted, counter circuit 422 is electrically connected to sense amplifier 412, and accordingly receives outputs from sense amplifier 412. Based on the outputs from sense amplifier 412, counter circuit 422 can count the number of matches returned by the second match line ML2 (e.g., count a number of comparisons where the voltage of the second match line ML2 exceeded the threshold voltage).

As depicted, logic circuit 432 is electrically connected to counter circuit 422, and accordingly receives outputs from counter circuit 422. Based on the outputs from counter circuit 422, logic circuit 432 can determine whether the counted number of matches satisfies the pre-determined parity condition (e.g., an odd number of matches) and output a signal indicating whether the input vector satisfies or violates the k-XOR-SAT clause programmed to the top row of CAM cells (i.e., $(q \oplus \neg r \oplus s)$).

In various implementations, logic circuits 430 and 432 may be connected to a processor (or in certain implementations, an additional logic circuit) that determines whether the input vector satisfies k-XOR-SAT formula 450. For example, if the processor receives signals from both of logic circuits 430 and 432 indicating that the input vector satisfies their respective k-XOR-SAT clauses, the processor may determine that the input vector satisfies k-XOR-SAT formula 450. A truth table 470 for evaluating k-XOR-SAT formula 450 using CAM-based circuit 400 is depicted in FIG. 4B. As depicted, k-XOR-SAT formula 450 is solved when (f=1).

As alluded to above, CAM-based circuit 400 may be used to implement larger Boolean satisfiability problems as well. For example, CAM-based circuit 400 may include additional rows programmed to store additional clauses of a larger Boolean satisfiability problem. These additional rows may be programmed to store k-XOR-SAT clauses, but k-SAT clauses as well. Where CAM-based circuit 400 is also used to implement k-SAT clauses, the match lines associated with the k-SAT clauses may not include the auxiliary counting and logic circuits described in conjunction with FIG. 4A. This is because implementing the k-SAT clauses may not involve counting a number of matches returned by CAM cells of a common row. Where the k-SAT clauses are implemented in DNF (as described in conjunction with FIGS. 2 and 3A-3B), match lines outputs associated with the DNF k-SAT clauses—or alternatively match line outputs associated with the k-XOR-SAT clauses—may be connected to logic circuits and/or inverters to account for the fact that the original k-SAT clauses converted to DNF for CAM programming are satisfied by a mismatch, whereas the k-XOR-SAT clauses implemented on CAM-based circuit 400 are satisfied by a match.

Figure 6:
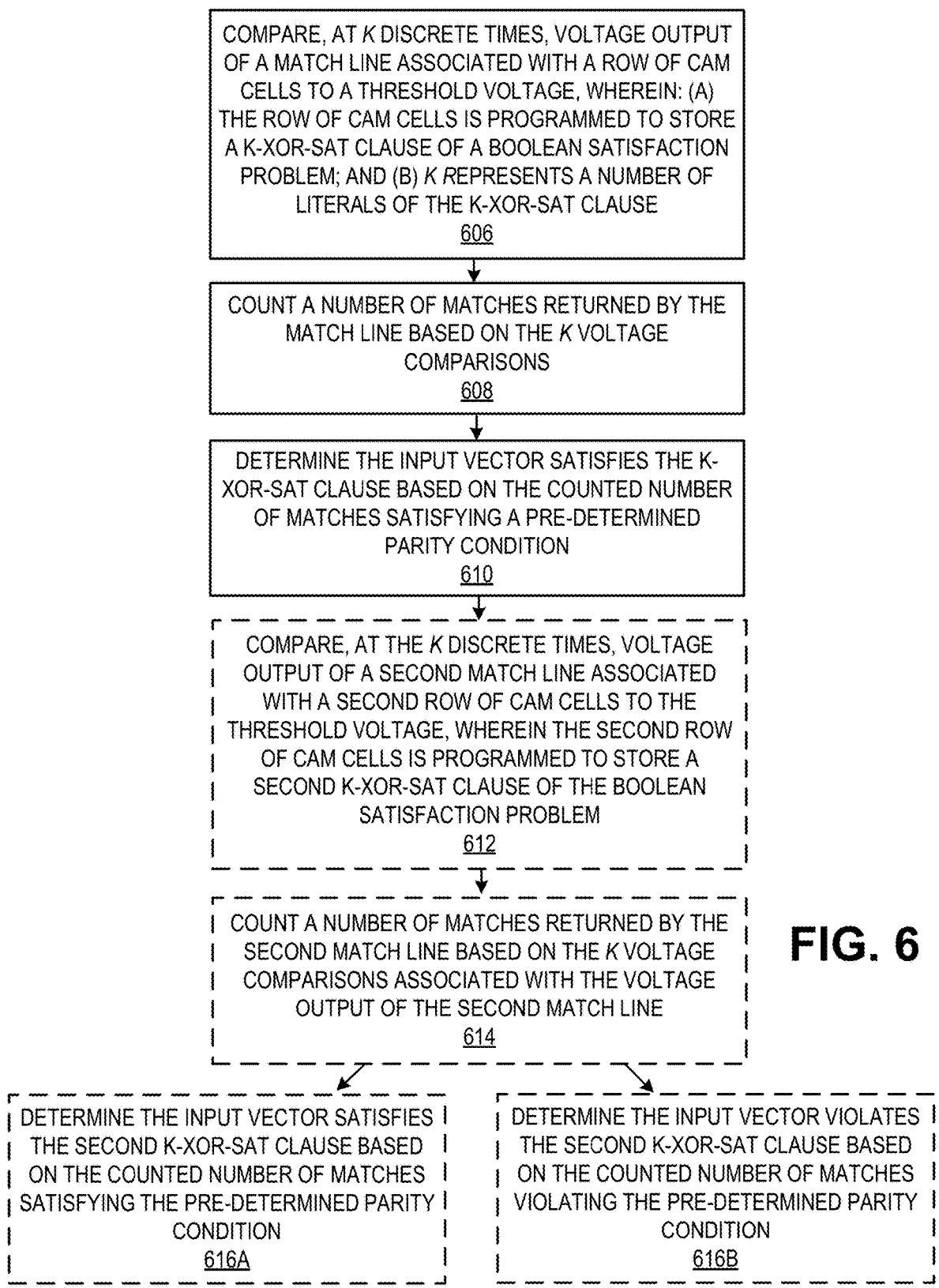
FIG. 6 depicts an example flowchart for solving a Boolean satisfiability problem using a CAM-based circuit, in accordance with examples of the presently disclosed technology.

FIG. 6 depicts an example flowchart for solving a Boolean satisfiability problem using a CAM-based circuit, in accordance with various examples of the presently disclosed technology.

Operation 606 comprises comparing, at k discrete times, voltage output of a match line associated with a row of CAM cells to a threshold voltage. The row of CAM cells may be programmed to store a k-XOR-SAT clause of a Boolean satisfiability problem. k may represent a number of literals of the k-XOR-SAT clause. Accordingly, the row of CAM cells may comprise at least k literal-representing CAM cells.

A literal-representing CAM cell of the k literal-representing CAM cells can be programmed to store a literal of the k-XOR-SAT clause. The literal-representing CAM cell may be programmed to store a first value (e.g., a logical zero or a logical one) when the literal is negated in the k-XOR-SAT clause. The literal-representing CAM cell may be programmed to store a second value (e.g., the other of the logical zero and the logical one) when the literal is not negated in the k-XOR-SAT clause. As alluded to above, programming the literal-representing CAM cell may comprise programming conductance of one or more memristors of the literal-representing CAM cell. As described above, operation 606 may be performed by a sense amplifier electrically connected to the match line.

Operation 608 comprises counting a number of matches returned by the match line based on the k voltage comparisons. As alluded to above, counting the number of matches returned by the match line based on the k voltage comparisons may comprise counting a number of the k voltage comparisons where the voltage output of the match line exceeded the threshold voltage. As described above, operation 608 may be performed by a counting circuit electrically connected to the sense amplifier.

Operation 610 comprises determining the input vector satisfies the k-XOR-SAT clause based on the counted number of matches satisfying a pre-determined parity condition. In certain implementations, the pre-determined parity condition may comprise an odd number of matches. In other implementations, the pre-determined parity condition may comprise an even number of matches. As described above, operation 610 may be performed by a processor that receives output from a logic circuit electrically connected to the counting circuit. The output from the logic circuit may be a signal indicating the input vector satisfies the k-XOR-SAT clause based on the counted number of matches satisfying the pre-determined parity condition.

As depicted, in certain implementations the flow chart may further comprise operations 612-616. Here, it should be understood that due to the parallel search capabilities of CAMs, operations 612-616 may be performed in parallel (i.e., approximately concurrently) with operations 606-610.

For example, operation 612 may comprise comparing, at the k discrete times, voltage output of a second match line associated with a second row of CAM cells to the threshold voltage. The second row of CAM cells may be programmed to store a second k-XOR-SAT clause of the Boolean satisfiability problem. In certain implementations, the second k-XOR-SAT clause may comprise less than k literals. For example, the second k-XOR-SAT clause may comprise (k–n) literals. Accordingly, the second row of CAM cells may comprise (k–n) literal-representing CAM cells and n non-literal-representing CAM cells. As alluded to above, the n non-literal-representing CAM cells may be programmed to store wildcard values that always return a match such that they do not disrupt evaluation of the second k-XOR-SAT clause programmed to the second row of CAM cells. As described above, operation 612 may be performed by a second sense amplifier electrically connected to the second match line.

Operation 614 comprises counting a number of matches returned by the second match line based on the k voltage comparisons associated with the voltage output of the second match line. As alluded to above, counting the number of matches returned by the second match line may comprise counting a number of the k voltage comparisons associated with the voltage output of the second match line where the voltage output of the second match line exceeded the threshold voltage. As described above, operation 614 may be performed by a second counting circuit electrically connected to the second sense amplifier.

Operation 616A comprises determining the input vector satisfies the second k-XOR-SAT clause based on the counted number of matches satisfying the pre-determined parity condition. Alternatively, operation 616B comprises determining the input vector violates the second k-XOR-SAT clause based on the counted number of matches violating the pre-determined parity condition. As described above, operations 616A-B may be performed by a processor that receives output from a second logic circuit electrically connected to the second counting circuit. A first output (corresponding with operation 616A) from the second logic circuit may be a signal indicating the input vector satisfies the k-XOR-SAT clause based on the counted number of matches satisfying the pre-determined parity condition. A second output (corresponding with operation 616B) from the second logic circuit may be a signal indicating the input vector violates the k-XOR-SAT clause based on the counted number of matches violating the pre-determined parity condition. In various implementations, a common (i.e., the same) processor may perform operations 616A-B and operation 610. In certain implementations, the processor may also determine whether the input vector satisfies or violates the Boolean satisfiability problem based on outputs from the logic circuits of the CAM-based circuit. For example, if the processor receives indicating the input vector satisfies all the clauses programmed to the CAM-based circuit, the processor may determine the input vector satisfies the Boolean satisfiability problem.

Figure 7:
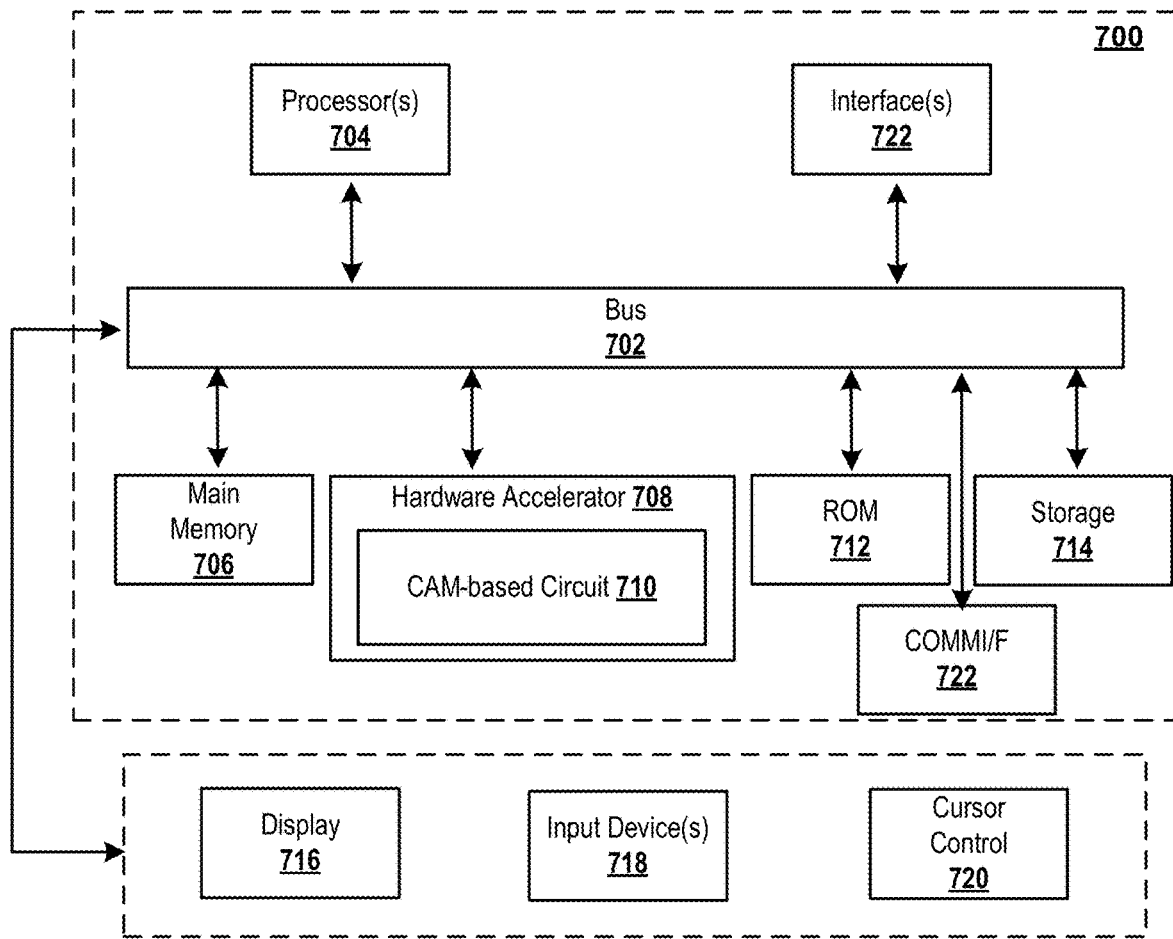
FIG. 7 depicts a block diagram of an example computer system in which various of the examples described herein may be implemented.

FIG. 7 depicts a block diagram of an example computer system 700 in which various of the examples described herein may be implemented.

The computer system 700 includes a bus 712 or other communication mechanism for communicating information, one or more hardware processors 704 coupled with bus 712 for processing information. Hardware processor(s) 704 may be, for example, one or more general purpose microprocessors.

The computer system 700 also includes a main memory 706, such as a random access memory (RAM), cache and/or other dynamic storage devices, coupled to bus 712 for storing information and instructions to be executed by processor 704. Main memory 706 also may be used for storing temporary variables or other intermediate information during execution of instructions to be executed by processor 704. Such instructions, when stored in storage media accessible to processor 704, render computer system 700 into a special-purpose machine that is customized to perform the operations specified in the instructions.

The computer system 700 further includes a read only memory (ROM) 712 or other static storage device coupled to bus 712 for storing static information and instructions for processor 704. A storage device 714, such as a magnetic disk, optical disk, or USB thumb drive (Flash drive), etc., is provided and coupled to bus 712 for storing information and instructions.

Computer system 700 additionally includes hardware accelerator 708. Hardware accelerator 708 may be configured to execute instructions (i.e. programming or software code) stored in the main memory 706, read-only memory (ROM) 712, and/or storage device 714 to encode a set of logical rules embodied in a Boolean satisfiability problem (e.g., a k-XOR-SAT problem) into an CAM-based circuit 710. In an example implementation, the exemplary hardware accelerator 708 may include multiple integrated circuits, which in turn, can include Application-Specific Integrated Circuits (ASICs), Field Programmable Gate Arrays (FPGAs) or other Very Large Scale Integrated circuits (VLSIs). The integrated circuits of the exemplary hardware accelerator 708 may be specifically optimized to perform a discrete subset of computer processing operations, or execute a discrete subset of computer-executable instructions, in an accelerated manner. For example, hardware accelerator 708 may be configured or manufactured to implement a set of logical rules embodied in a Boolean satisfiability problem (e.g., a k-XOR-SAT problem) into an CAM-based circuit 710.

CAM-based circuit 710 may include a non-volatile memory built using technologies that include for instance, resistive switching memory (i.e. memristor), phase change memory, magneto-resistive memory, ferroelectric memory, some other resistive random access memory device (ReRAM), or combinations of those technologies. More generally, CAM-based circuit 710 may be implemented using technologies that permit the CAM-based circuit 710 to hold its contents even when power is lost or otherwise removed. Thus, data in the CAM-based circuit 710 "persists" and the CAM-based circuit 710 can act as what is known as a "non-volatile memory."

The computer system 700 may be coupled via bus 712 to a display 716, such as a liquid crystal display (LCD) (or touch screen), for displaying information to a computer user. An input device 718, including alphanumeric and other keys, is coupled to bus 712 for communicating information and command selections to processor 704. Another type of user input device is cursor control 720, such as a mouse, a trackball, or cursor direction keys for communicating direction information and command selections to processor 704 and for controlling cursor movement on display 716. In some embodiments, the same direction information and command selections as cursor control may be implemented via receiving touches on a touch screen without a cursor.

The computing system 700 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 700 may implement the techniques described herein using customized hard-wired logic, one or more ASICs or FPGAs, firmware and/or program logic which in combination with the computer system causes or programs computer system 700 to be a special-purpose machine. According to one embodiment, the techniques herein are performed by computer system 700 in response to processor(s) 704 executing one or more sequences of one or more instructions contained in main memory 706. Such instructions may be read into main memory 706 from another storage medium, such as storage device 714. Execution of the sequences of instructions contained in main memory 706 causes processor(s) 704 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 714. Volatile media includes dynamic memory, such as main memory 706. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 712. Transmission media can also take the form of acoustic or light waves, such as those generated during radio-wave and infra-red data communications.

The computer system 700 also includes a communication/network interface 722 coupled to bus 712. Network interface 722 provides a two-way data communication coupling to one or more network links that are connected to one or more local networks. For example, communication interface 722 may be an integrated services digital network (ISDN) card, cable modem, satellite modem, or a modem to provide a data communication connection to a corresponding type of telephone line. As another example, network interface 722 may be a local area network (LAN) card to provide a data communication connection to a compatible LAN (or WAN component to communicated with a WAN). Wireless links may also be implemented. In any such implementation, network interface 718 sends and receives electrical, electromagnetic or optical indicators that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet." Local network and Internet both use electrical, electromagnetic or optical indicators that carry digital data streams. The indicators through the various networks and the indicators on network link and through communication interface 722, which carry the digital data to and from computer system 700, are example forms of transmission media.

The computer system 700 can send messages and receive data, including program code, through the network(s), network link and communication interface 718. In the Internet example, a server might transmit a requested code for an application program through the Internet, the ISP, the local network and the communication interface 722.

The received code may be executed by processor 704 as it is received, and/or stored in storage device 714, or other non-volatile storage for later execution.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another, or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAS, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 700.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A circuit comprising:
    a row of content addressable memory (CAM) cells programmed to store a k-exclusive OR-satisfaction (k-XOR-SAT) clause of a Boolean satisfiability problem;
    a sense amplifier that, in response to an input vector being applied to the row of CAM cells:
        compares, at k discrete times, voltage output of a match line associated with the row of CAM cells to a threshold voltage, wherein k represents a number of literals of the k-XOR-SAT clause;
    a counter circuit that counts a number of matches returned by the match line based on the k voltage comparisons of the sense amplifier; and
    a logic circuit that outputs a signal indicating the input vector satisfies the k-XOR-SAT clause based on the counted number of matches satisfying a pre-determined parity condition.

2. The circuit of claim 1, wherein:
    the row of CAM cells comprises k literal-representing CAM cells; and
    a literal-representing CAM cell of the k literal-representing CAM cells is programmed to store a literal of the k-XOR-SAT clause.

3. The circuit of claim 1, wherein the counted number of matches corresponds with a number of the k voltage comparisons where the voltage output of the match line exceeded the threshold voltage.

4. The circuit of claim 1, wherein the pre-determined parity condition comprises an odd number of matches.

5. The circuit of claim 2, wherein programming the literal-representing CAM cell to store the literal of the k-XOR-SAT clause comprises:
    programming the literal-representing CAM cell to store a first value when the literal is negated in the k-XOR-SAT clause; and
    programming the literal-representing CAM cell to store a second value when the literal is not negated in the k-XOR-SAT clause.

6. The circuit of claim 5, wherein:
    the row of CAM cells further comprises a non-literal-representing CAM cell programmed to store a wildcard value.

7. The circuit of claim 2, wherein programming the literal-representing CAM cell to store the literal of the k-XOR-SAT clause comprises:

programming conductance of a memristor included in the literal-representing CAM cell.

8. The circuit of claim 1, further comprising:
a second row of CAM cells programmed to store a second k-XOR-SAT clause of the Boolean satisfiability problem;
a second sense amplifier that, in response to the input vector being applied to the second row of CAM cells:
compares, at the k discrete times, voltage output of a second match line associated with the second row of aCAM cells to the threshold voltage;
a second counter circuit that counts a number of matches returned by the second match line based on the k voltage comparisons of the second sense amplifier; and
a second logic circuit that outputs a signal indicating the input vector satisfies the second k-XOR-SAT clause based on the counted number of matches satisfying the pre-determined parity condition.

9. The circuit of claim 8, further comprising a processor, that in response to receiving the signal from the first logic circuit and the signal from the second logic circuit:
determines the input vector satisfies the Boolean satisfiability problem.

10. A method of solving a Boolean satisfiability problem using a CAM-based circuit, the method comprising:
comparing, at k discrete times, voltage output of a match line associated with a row of CAM cells to a threshold voltage, wherein:
the CAM-based circuit comprises the row of CAM cells,
the row of CAM cells is programmed to store a k-XOR-SAT clause of the Boolean satisfiability problem, and
k represents a number of literals of the k-XOR-SAT clause;
counting a number of matches returned by the match line based on the k voltage comparisons; and
determining the input vector satisfies the k-XOR-SAT clause based on the counted number of matches satisfying a pre-determined parity condition.

11. The method of claim 10, further comprising:
comparing, at the k discrete times, voltage output of a second match line associated with a second row of CAM cells to the threshold voltage, wherein:
the CAM-based circuit comprises the second row of CAM cells,
the second row of CAM cells is programmed to store a second k-XOR-SAT clause of the Boolean satisfiability problem,
counting a number of matches returned by the second match line based on the k voltage comparisons associated with the voltage output of the second match line; and
determining the input vector satisfies the second k-XOR-SAT clause based on the counted number of matches returned by the second match line satisfying the pre-determined parity condition.

12. The method of claim 10, further comprising:
comparing, at the k discrete times, voltage output of a second match line associated with a second row of CAM cells to the threshold voltage, wherein:
the CAM-based circuit comprises the second row of CAM cells,
the second row of CAM cells is programmed to store a second k-XOR-SAT clause of the Boolean satisfiability problem,
counting a number of matches returned by the second match line based on the k voltage comparisons associated with the voltage output of the second match line; and
determining the input vector violates the second k-XOR-SAT clause based on the counted number of matches returned by the second match line violating the pre-determined parity condition.

13. The method of claim 11, further comprising:
determining the input vector satisfies the Boolean satisfiability problem.

14. The method of claim 12, further comprising:
determining the input vector violates the Boolean satisfiability problem.

15. The method of claim 10, wherein:
the row of CAM cells comprises k literal-representing CAM cells; and
a literal-representing CAM cell of the k literal-representing CAM cells is programmed to store a literal of the k-XOR-SAT clause.

16. The method of claim 15, further comprising:
programming the literal-representing CAM cell to store a first value when the literal is negated in the k-XOR-SAT clause; and
programming the CAM cell to store a second value when the literal is not negated in the k-XOR-SAT clause.

17. The method of claim 15, further comprising programming the literal-representing CAM cell to store the literal of the k-XOR-SAT clause by programming conductance of a memristor included in the literal-representing CAM cell.

18. A CAM-based circuit comprising:
a row of CAM cells programmed to store a k-XOR-SAT clause of a Boolean satisfiability problem, wherein:
k represents a number of literals of the k-XOR-SAT clause,
the row of CAM cells comprises k literal-representing CAM cells, and
a literal-representing CAM cell of the k literal-representing CAM cells is programmed to store a literal of the k-XOR-SAT clause;
a sense amplifier that, in response to an input vector being applied to the row of CAM cells:
compares, at k discrete times, voltage output of a match line associated with the row of CAM cells to a threshold voltage;
a counter circuit that counts a number of matches returned by the match line based on the k voltage comparisons of the sense amplifier; and
a logic circuit that outputs a signal indicating the input vector satisfies the k-XOR-SAT clause based on the counted number of matches satisfying a pre-determined parity condition.

19. The CAM-based circuit of claim 18, wherein the counted number of matches corresponds with a number of the k voltage comparisons where the voltage output of the match line exceeded the threshold voltage.

20. The CAM-based circuit of claim 18, wherein programming the literal-representing CAM cell to store the literal of the k-XOR-SAT clause comprises:
programming the literal-representing CAM cell to store a first value when the literal is negated in the k-XOR-SAT clause; and
programming the literal-representing CAM cell to store a second value when the literal is not negated in the k-XOR-SAT clause.

* * * * *